United States Patent
Lee et al.

(10) Patent No.: US 12,040,018 B2
(45) Date of Patent: Jul. 16, 2024

(54) METHOD FOR PROGRAMMING MEMORY

(71) Applicant: Taiwan Semiconductor Manufacturing Company, Ltd., Hsinchu (TW)

(72) Inventors: I-Che Lee, Taipei (TW); Huai-Ying Huang, Jhonghe (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 40 days.

(21) Appl. No.: 18/077,580

(22) Filed: Dec. 8, 2022

(65) Prior Publication Data
US 2023/0097518 A1 Mar. 30, 2023

Related U.S. Application Data

(62) Division of application No. 17/199,849, filed on Mar. 12, 2021, now Pat. No. 11,527,289.

(51) Int. Cl.
*G11C 16/10* (2006.01)
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/004* (2013.01)

(58) Field of Classification Search
CPC .... G11C 2013/0078; G11C 2013/0092; G11C 2213/79; G11C 16/10; G11C 16/08; G11C 16/24; G11C 16/30; G11C 13/0069; G11C 13/0026; G11C 13/0028; G11C 13/004
See application file for complete search history.

(56) References Cited

U.S. PATENT DOCUMENTS

| | | | |
|---|---|---|---|
| 2001/0031027 A1 | 10/2001 | Lindsay | |
| 2002/0044126 A1 | 4/2002 | Aoki | |
| 2002/0114244 A1 | 8/2002 | Kelly et al. | |
| 2004/0103328 A1* | 5/2004 | Ichien | G06F 1/3228 |
| | | | 713/300 |

(Continued)

OTHER PUBLICATIONS

Wang et al. "Comparative Evaluation of Spin-Transfer-Torque and Magnetoelectric Random Access Memory" IEEE Journal on Emerging and Selected Topics in Circuits and Systems, vol. 6, No. 2, Jun. 2016, published on Apr. 6, 2016.

(Continued)

*Primary Examiner* — Hien N Nguyen
(74) *Attorney, Agent, or Firm* — Eschweiler & Potashnik, LLC (57) ABSTRACT

A method includes setting a current level of a write signal to a first non-zero value for a first period of time. The write signal is provided to a memory element during the first period of time. The current level of the write signal is adjusted from the first non-zero value to a second non-zero value, different from the first non-zero value, for a second period of time. The write signal is provided to the memory element during the second period of time. The current level of the write signal is adjusted from the second non-zero value to a third value, different from the first non-zero value and different from the second non-zero value, for a third period of time. The write signal is provided to the memory element during the third period of time.

20 Claims, 8 Drawing Sheets

(56) References Cited

U.S. PATENT DOCUMENTS

| | | | |
|---|---|---|---|
| 2007/0014157 A1* | 1/2007 | Hung | G11C 16/24 |
| | | | 365/185.2 |
| 2010/0246649 A1 | 9/2010 | de Ruijter et al. | |
| 2014/0347918 A1 | 11/2014 | Lee et al. | |
| 2020/0118602 A1* | 4/2020 | Yang | G11C 11/417 |
| 2021/0135093 A1* | 5/2021 | Lin | H10N 50/01 |
| 2022/0319557 A1* | 10/2022 | Jain | G11C 5/147 |
| 2022/0366984 A1* | 11/2022 | Wang | G11C 17/16 |

OTHER PUBLICATIONS

Cai et al. "High Performance MRAM with Spin-Transfer-Torque and Voltage-Controlled Magnetic Anisotropy Effects" Appl. Sci. 2017, 7, 929; doi:10.3390/app7090929, published on Sep. 11, 2017.
Xu et al. "Designing a Practical Access Point Association Protocol" 2010 Proceedings IEEE INFOCOM, published on May 6, 2010.
Notice of Allowance dated Jul. 25, 2022 for U.S. Appl. No. 17/199,849.

* cited by examiner

┌─────────────────────────────────────────────────────┐
│ Apply a first voltage at a source of the transistor, a second voltage at the drain of the transistor, and a third voltage at the gate of the transistor for a first period of time │ — 1102
└─────────────────────────────────────────────────────┘
                          ↓
┌─────────────────────────────────────────────────────┐
│ Apply the first voltage at a source of the transistor, the second voltage at the drain of the transistor, and a fourth voltage, different from the third voltage, at the gate of the transistor for a second period of time │ — 1104
└─────────────────────────────────────────────────────┘
                          ↓
┌─────────────────────────────────────────────────────┐
│ Apply a first voltage at the source of the transistor, the second voltage at the drain of the transistor, and a fifth voltage, different from the third voltage and the fourth voltage, at the gate of the transistor for a third period of time │ — 1106
└─────────────────────────────────────────────────────┘

┌─────────────────────────────────────────────────────┐
│ Pass a first current through a memory element for a first period of time, the first current having a first magnitude and a first sign │ — 1202
└─────────────────────────────────────────────────────┘
                          ↓
┌─────────────────────────────────────────────────────┐
│ Pass a second current through the memory element for a second period of time, the second current having the first sign and having a second magnitude different from the first magnitude │ — 1204
└─────────────────────────────────────────────────────┘
                          ↓
┌─────────────────────────────────────────────────────┐
│ Pass a third current through the memory element for a third period of time, the third current having a third magnitude different from the first magnitude and the second magnitude │ — 1206
└─────────────────────────────────────────────────────┘

Fig. 12

METHOD FOR PROGRAMMING MEMORY

REFERENCE TO RELATED APPLICATION

This Application is a Divisional of U.S. application Ser. No. 17/199,849, filed on Mar. 12, 2021, the contents of which are hereby incorporated by reference in their entirety.

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include magnetoresistive random-access memory (MRAM), resistive random-access memory (RRAM), phase-change random-access memory (PCRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern integrated chips include memory arrays. For example, a memory array comprises a plurality of bit lines and a plurality of word lines coupled to a plurality of memory elements arranged in a plurality of rows and columns. Some memory arrays may also comprise one or more source lines coupled to the plurality of memory elements. A first memory cell of the memory array comprises a first memory element coupled to a first transistor configured to selectively provide access to the first memory cell. The first memory element and the first transistor are coupled in series between a first bit line and a first source line. Further, a gate of the first transistor is coupled to a first word line.

During operation of the memory array, the first memory cell may undergo a programming process. For example, the first memory cell may undergo a write operation to in order to store a bit in the memory cell (e.g., to set the state of the memory cell to a logic "1" or a logic "0"). For example, when the first memory element comprises a magnetic tunnel junction (MTJ), a write operation comprises passing a current through the MTJ to create a magnetic field in the MTJ. The magnetic field induced in the MTJ sets a polarity of a free layer of the MTJ. The polarity of the free layer of the MTJ relative to a polarity of a reference layer of the MTJ determines the resistance of the MTJ. The resistance of the MTJ determines the logic state of the MTJ.

The current may have a single magnitude that is maintained for the duration of time in which the current is passed through the memory element. The duration of the current multiplied by the magnitude of the current must be greater than or equal to a programming threshold value to successfully program the memory element. For example, the current magnitude may be large and the duration may be brief, or vice versa. Because a high current and/or a long period of time may be required to perform the write operation, a performance (e.g., a power efficiency and/or a speed) of write operation may be low.

Various embodiments of the present disclosure are related to a method for programming a memory cell that improves a performance of the programming. The method comprises setting a current level of a write signal to a first value for a first period of time. The write signal is provided to a memory element during the first period of time. The current level of the write signal is adjusted from the first value to a second value, different from the first value, for a second period of time. The write signal is provided to the memory element during the second period of time. The current level of the write signal is adjusted from the second value to a third value, different from the first value and different from the second value, for a third period of time. The write signal is provided to the memory element during the third period of time.

By providing a signal having multiple current levels to the memory element to program the memory element, a performance of the programming (e.g., a speed and/or power consumption of the programming) may be improved. For example, the first value and the second value can be tuned in order to achieve a desired balance between programming duration and power consumption. In some embodiments, by increasing the first value and/or the second value, a duration of the programming may be reduced. In some embodiments, by reducing the first value and/or the second value, a power consumption of the programming may be reduced. Thus, by tuning both the first value and the second value, an optimal balance between programming duration and power consumption may be achieved.

Figure 1A:
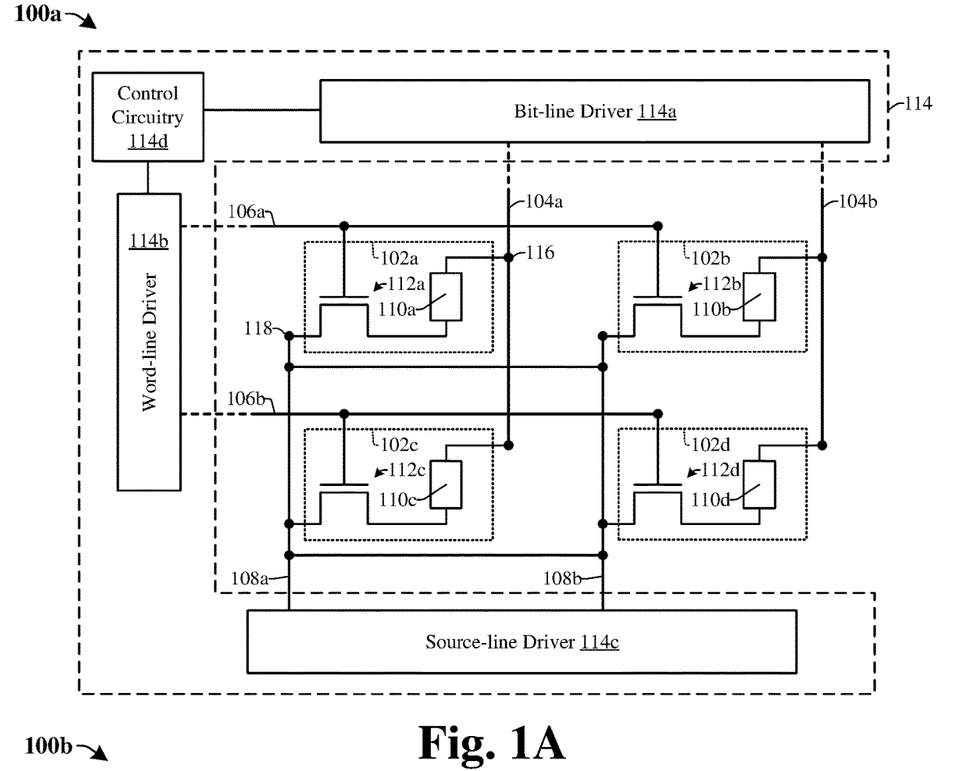
FIG. 1A illustrates a diagram of some embodiments of a memory array comprising a plurality of memory cells.
Figure 1B:
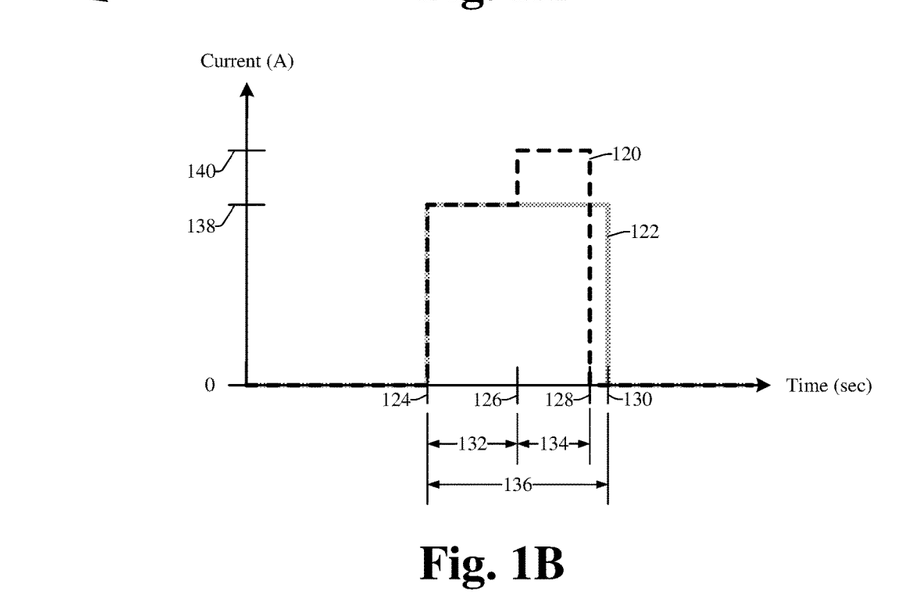
FIG. 1B illustrates a graph of some embodiments of a first signal and a reference signal for programming the plurality of memory cells of FIG. 1A.

Referring to FIGS. 1A and 1B simultaneously, FIG. 1A illustrates a diagram 100a of some embodiments of a memory array comprising a plurality of memory cells (e.g., 102a-102d), while FIG. 1B illustrates a graph 100b of some embodiments of a first signal 120 and a reference signal 122 for programming the plurality of memory cells (e.g., 102a-102d).

As shown in diagram 100a of FIG. 1A, the memory array comprises a plurality of bit lines 104a-104b and a plurality of word lines 106a-106b arranged in a plurality of rows and columns. For example, the memory array comprises a first bit line 104a and a second bit line 104b arranged in columns, and a first word line 106a and a second word line 106b arranged in rows. In some embodiments, the memory array also comprises a first source line 108a and a second source line 108b. In some embodiments, the first source line 108a is coupled to the second source line 108b.

The memory array further comprises a plurality of memory cells 102a-102d coupled to the plurality of bit lines 104a-104b, the plurality of word lines 106a-106b, and the one or more source lines 108a-108b. For example, the memory array comprises a first memory cell 102a coupled to the first bit line 104a, the first word line 106a, and the first source line 108a. The first memory cell 102a comprises a first memory element 110a coupled to a first transistor 112a. The first memory element 110a and the first transistor 112a are coupled in series between the first bit line 104a and the first source line 108a. A gate of the first transistor 112a is coupled to the first word line 106a.

Similarly, a second memory cell 102b, a third memory cell 102c, and a fourth memory cell 102d comprise a second memory element 110b, a third memory element 110c, and a fourth memory element 110d, respectively, and further comprise a second transistor 112b, a third transistor 112c, and a fourth transistor 112d, respectively.

In some embodiments, the memory array is or comprises a magnetoresistive random access memory (MRAM) array. In such embodiments, the first memory element 110a is or comprises a first magnetic tunnel junction (MTJ), the second memory element 110b is or comprises a second MTJ, the third memory element 110c is or comprises a third MTJ, and the fourth memory element 110d is or comprises a fourth MTJ.

In some embodiments, circuitry 114 is coupled to the first bit line 104a, the second bit line 104b, the first source line 108a, the second source line 108b, the first word line 106a, the second word line 106b, or any combination of the foregoing. The circuitry 114 is configured to program the plurality of memory cells 102a-102d of the memory array. In some embodiments, the programming comprises writing to one of the memory elements (e.g., 110a-110d) to set a state of that memory element. In some embodiments, the circuitry 114 may comprise a bit line driver 114a coupled to the plurality of bit lines 104a-104b and a word line driver 114b coupled to the plurality of word lines 106a-106b. In some embodiments, the circuitry 114 may additionally comprise a source line driver 114c coupled to the plurality of source lines 108a-108b. In some other embodiments, the plurality of source lines 108a-108b may be coupled to ground. In some embodiments, the circuitry 114 may comprise a control unit 114d configured to provide control signals to the bit line driver 114a, the word line driver 114b, and/or the source line driver 114c. In some embodiments, the control signals control addressing of the bit line driver 114a, the word line driver 114b, and/or the source line driver 114c, to enable the circuitry 114 to access specific memory cells within the memory array.

In some embodiments, the circuitry 114 performs a write operation by passing current through one of the memory elements. For example, in some embodiments, the write operation is performed by operating the word line driver 114b to assert a transistor while operating the bit line driver 114a to generate a current on a bit line associated with the transistor. For example, a write operation may be performed on the first memory cell 102a by operating the word line driver 114b to generate a voltage on the first word line 106a to turn on the first transistor 112a, and by operating the bit line driver 114a to generate a first signal on the first bit line 104a. As a result, current passes through the first memory element 110a, from the first bit line 104a to the first source line 108a (e.g., from point 116 to point 118), or vice versa (e.g., from point 118 to point 116), depending on desired state of first memory element 110a. In other words, in some embodiments, passing current through the first memory element 110a in a first direction (e.g., from the first bit line 104a to the first source line 108a) may set the first memory element to a first state (e.g., a logic "0" state), while passing current through the first memory element 110a in a second direction (e.g., from the first source line 108a to the first bit line 104a) may set the first memory element to a second state (e.g., a logic "1" state).

In some embodiments, the magnitude of the current and the duration of the current used to write the first memory element 110a may need to meet some general requirements to successfully set the state of the first memory element 110a. For example, in some embodiments, a product of the magnitude of the current passed through the first memory element 110a multiplied by the amount of time the current is passed through the first memory element 110a may need to be greater than, or equal to, a programming threshold value in order to successfully set the state of the first memory element 110a.

As shown in graph 100b of FIG. 1B, in some embodiments, the circuitry 114 (e.g., the bit line driver 114a and/or the source line driver 114c) provides a first signal 120 to the first memory element 110a to write the first memory element 110a. At a reference start time 124, the circuitry 114 adjusts a current of the first signal 120 to a first value 138 (e.g., some first non-zero value). The current of the first signal 120 is maintained at the first value 138 until a first time 126 is reached, at which point the circuitry 114 adjusts the current of the first signal 120 to a second value 140 (e.g., some second non-zero value) different from the first value 138 (e.g., greater in magnitude than the first value). The current of the first signal 120 is maintained at the second value 140 until a second time 128 is reached, at which point the circuitry 114 may adjust the current of the first signal 120 to zero.

In other words, the circuitry 114 sets a current level of the first signal 120 to the first value 138 for a first period of time 132, the circuitry 114 adjusts the current level of the first signal 120 from the first value 138 to the second value 140 for a second period of time 134, and the circuitry 114 adjusts the current level of the first signal 120 from the second value 140 to a third value (e.g., zero) for at least a third period of time (not labeled). In some embodiments, prior to the first period of time 132 there is no current (e.g., 0 amps) passing through the first memory element 110a. In some embodiments, the first value 138 and the second value 140 have a same sign (e.g., are both positive or are both negative). In some embodiments, the first period of time 132 is longer than the second period of time 134. In some other embodiments, the first period of time 132 is shorter than the second period of time 134.

The product of the first value 138 multiplied by the first period of time 132, plus the product of the second value 140 multiplied by the second period of time 134 is greater than, or equal to, the programming threshold value for writing so that the first signal 120 is capable of successfully writing the first memory element 110a.

By providing the first signal 120 to the first memory element 110a to write the first memory element 110a, the time required to write the first memory element 110a may be reduced. For example, the time required to write the first memory element 110a using the first signal 120 may be less than the time required to write the first memory element 110a using a signal that has a single current level (e.g., a reference signal 122) for a reference period of time 136 which starts at the reference start time 124 and ends at a reference end time 130.

In some embodiments, because the second value 140 is greater than the first value 138, and because the current level of the first signal 120 is set to the second value 140 for the second period of time 134, the second time 128 (e.g., when the second period of time 134 ends) may be less than the reference end time 130 (e.g., when the reference period of time 136 ends) while the first signal 120 still satisfies the programming threshold value. In other words, in some embodiments, the sum of the first period of time 132 plus the second period of time 134 (e.g., the duration of the first signal 120) is less than the reference period of time 136 (e.g., the duration of the reference signal 122). Thus, the first signal 120 may reduce a time required to program the first memory element 110a.

Further, by providing the first signal 120 having multiple current levels to the first memory element 110a to program the first memory element 110a, a performance of the first signal may be tuned. For example, the first value 138 and the second value 140 can be tuned in order to achieve a desired balance between the time required to program the first memory element 110a and the power required to program the first memory element 110a. Thus, a performance of the programming may be optimized and/or improved.

In some embodiments, the circuitry 114 may set and/or adjust the current being provided to the first memory element 110a by controlling voltages applied to a source (not labeled), drain (not labeled), and gate (not labeled) of the first transistor 112a. For example, by applying a first voltage to the source of the first transistor 112a, a second voltage to the drain of the first transistor 112a, and a third voltage to the gate of the first transistor 112a for the first period of time 132, the first transistor 112a may be turned on to a first current level (e.g., the first value 138). Then, by adjusting the voltage applied to the gate to a fourth voltage for the second period of time 134, the first transistor 112a may be turned on to a second current level different from the first current level (e.g., the second value 140). Next, by adjusting the voltage applied to the gate to a fifth voltage for the third period of time (not labeled), the first transistor 112a may be turned off such that no current flows through the first memory element 110a.

Although FIG. 1A illustrates memory array comprising four memory cells, it will be appreciated that an array comprising some other number of memory cells is also feasible. Further, although the first source line 108a and the second source in 108 are illustrated as being coupled together, it will be appreciated that in some other embodiments, the first source line 108a and the second source line 108b may alternatively be electrically isolated from each other.

Although zero amps is used as a baseline current in the embodiments illustrated in FIG. 1B, it will be appreciated that in some embodiments, some other current value could be used as a baseline current.

Figure 2:
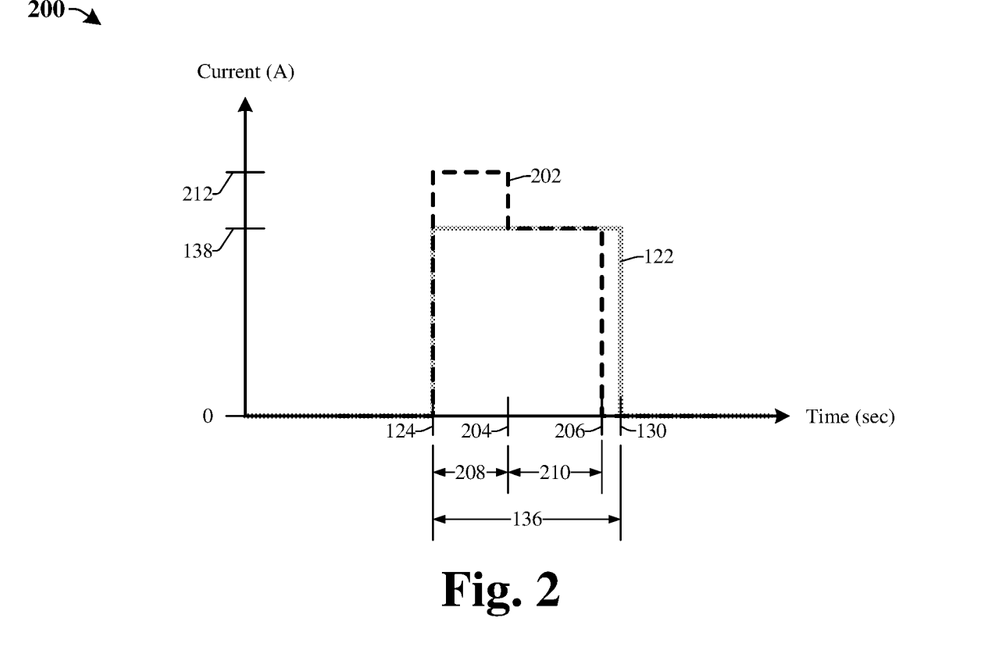
FIG. 2 illustrates a graph of some embodiments of a second signal for programming memory cells.

FIG. 2 illustrates a graph 200 of some embodiments of a second signal 202 for programming memory cells.

In some embodiments, circuitry (e.g., 114 of FIG. 1A) provides the second signal 202 to a memory element (e.g., 110a of FIG. 1A) to write the memory element. At a reference start time 124, the circuitry adjusts a current of the second signal 202 to a second value 212. The current of the second signal 202 is maintained at the second value 212 until a first time 204 is reached, at which point the circuitry adjusts the current of the second signal 202 to a first value 138 different from the second value 212 (e.g., lesser in magnitude than the second value 212). The current of the second signal 202 is maintained at the first value 138 until a second time 206 is reached, at which point the circuitry may adjust the current of the second signal 202 to zero.

In other words, the circuitry sets a current level of the second signal 202 to the second value 212 for a first period of time 208, the circuitry adjusts the current level of the second signal 202 from the second value 212 to the first value 138 for a second period of time 210, and the circuitry adjusts the current level of the second signal 202 from the first value 138 to a third value (e.g., zero) for at least a third period of time (not labeled). In some embodiments, prior to the first period of time 208 there is no current passing through the memory element. In some embodiments, the first value 138 and the second value 212 have the same sign.

The product of the second value 212 multiplied by the first period of time 208, plus the product of the first value 138 multiplied by the second period of time 210 is greater than, or equal to, the programming threshold value for writing so that the second signal 202 is capable of successfully writing the memory element.

Figure 3:
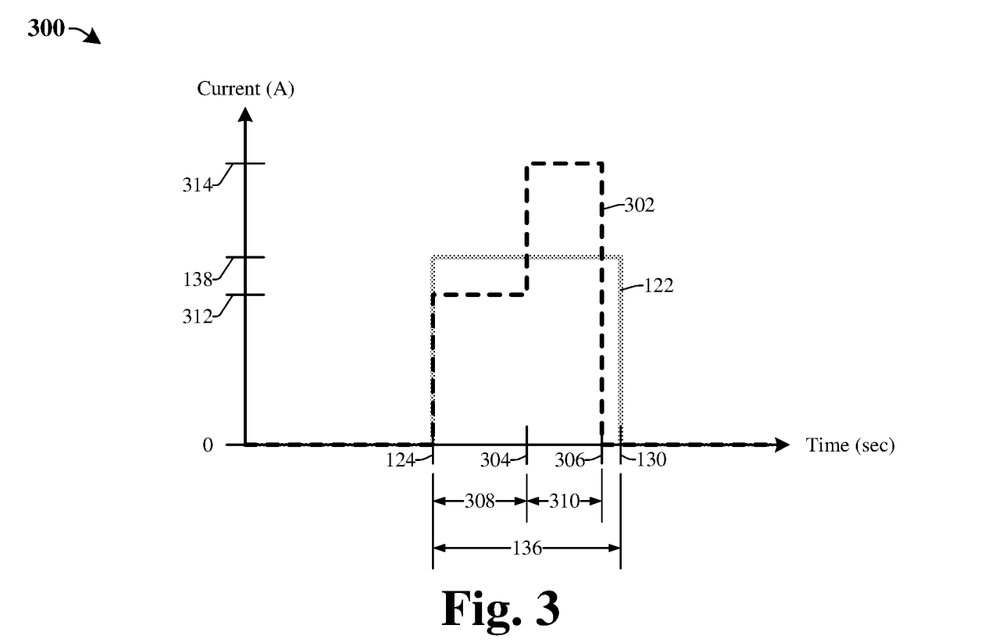
FIG. 3 illustrates a graph of some embodiments of a third signal for programming memory cells.

FIG. 3 illustrates a graph 300 of some embodiments of a third signal 302 for programming memory cells.

In some embodiments, circuitry (e.g., 114 of FIG. 1A) provides the third signal 302 to a memory element (e.g., 110a of FIG. 1A) to write the memory element. At a reference start time 124, the circuitry adjusts a current of the third signal 302 to a second value 312. The current of the third signal 302 is maintained at the second value 312 until a first time 304 is reached, at which point the circuitry adjusts the current of the third signal 302 to a third value 314 different from the second value 312. The current of the third signal 302 is maintained at the third value 314 until a second time 306 is reached, at which point the circuitry may adjust the current of the third signal 302 to zero.

In other words, the circuitry sets a current level of the third signal 302 to the second value 312 for a first period of time 308, the circuitry adjusts the current level of the third signal 302 from the second value 312 to the third value 314 for a second period of time 310, and the circuitry adjusts the current level of the third signal 302 from the third value 314 to a fourth value (e.g., zero) for at least a third period of time (not labeled). In some embodiments, prior to the first period of time 308 there is no current passing through the memory element. In some embodiments, the second value 312 and the third value 314 have a same sign.

The product of the second value 312 multiplied by the first period of time 308, plus the product of the third value 314 multiplied by the second period of time 310 is greater than, or equal to, the programming threshold value for writing so that the third signal 302 is capable of successfully writing the memory element.

In some other embodiments, the circuitry may alternatively set the current level of the third signal 302 to the second value 312 first and then subsequently adjust the current level to the third value 314.

Figure 4:
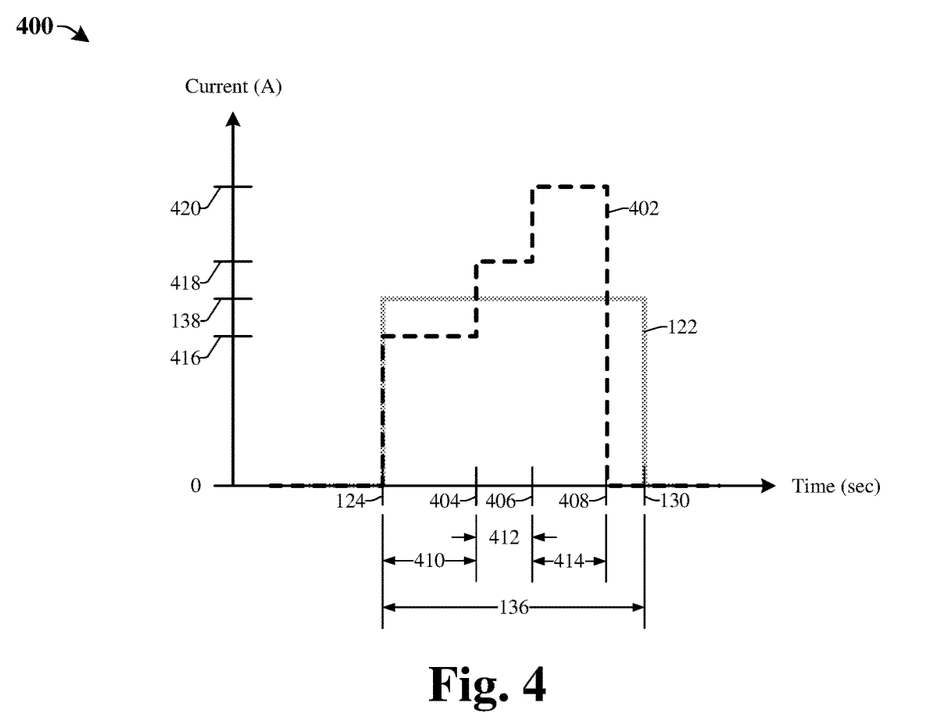
FIG. 4 illustrates a graph of some embodiments of a fourth signal for programming memory cells.

FIG. 4 illustrates a graph 400 of some embodiments of a fourth signal 402 for programming memory cells.

In some embodiments, circuitry (e.g., 114 of FIG. 1A) provides the fourth signal 402 to a memory element (e.g., 110a of FIG. 1A) to write the memory element. At a reference start time 124, the circuitry adjusts a current of the fourth signal 402 to a second value 416. The current of the fourth signal 402 is maintained at the second value 416 until a first time 404 is reached, at which point the circuitry adjusts the current of the fourth signal 402 to a third value 418 different from the second value 416. The current of the fourth signal 402 is maintained at the third value 418 until a second time 406 is reached, at which point the circuitry adjusts the current of the fourth signal 402 to a fourth value 420 different from the third value 418. The current of the fourth signal 402 is maintained at the fourth value 420 until a third time 408 is reached, at which point the circuitry may adjust the current of the fourth signal 402 to zero.

In other words, the circuitry sets a current level of the fourth signal 402 to the second value 416 for a first period of time 410, the circuitry adjusts the current level of the fourth signal 402 from the second value 416 to the third value 418 for a second period of time 412, the circuitry adjusts the current level of the fourth signal 402 from the third value 418 to the fourth value 420 for a third period of time 414, and the circuitry adjusts the current level of the fourth signal 402 from the fourth value 420 to a fifth value (e.g., zero) for at least a fifth period of time (not labeled). In some embodiments, the second value 416, the third value 418, and the fourth value 420 have a same sign. In some embodiments, each of the periods of time may have different durations.

The product of the second value 416 multiplied by the first period of time 410, plus the product of the third value 418 multiplied by the second period of time 412, plus the product of the fourth value 420 multiplied by the third period of time 414 is greater than, or equal to, the programming threshold value for writing so that the fourth signal 402 is capable of successfully writing the memory element.

In some other embodiments, the circuitry may alternatively set the current level of the fourth signal 402 to the fourth value 420 first, may subsequently set the current level of the third value 418, and may subsequently set the current level to the second value 416.

Although the fourth signal 402 is illustrated as having three separate current levels (e.g., 416, 418, 420), it will be appreciated that in some other embodiments, the fourth signal 402 may alternatively have some other number of separate current levels.

In some embodiments, by increasing the number of separate current levels that a write signal comprises, a balance between a duration of the write signal and a power consumption of the write signal may be further tuned and/or optimized.

Figure 5:
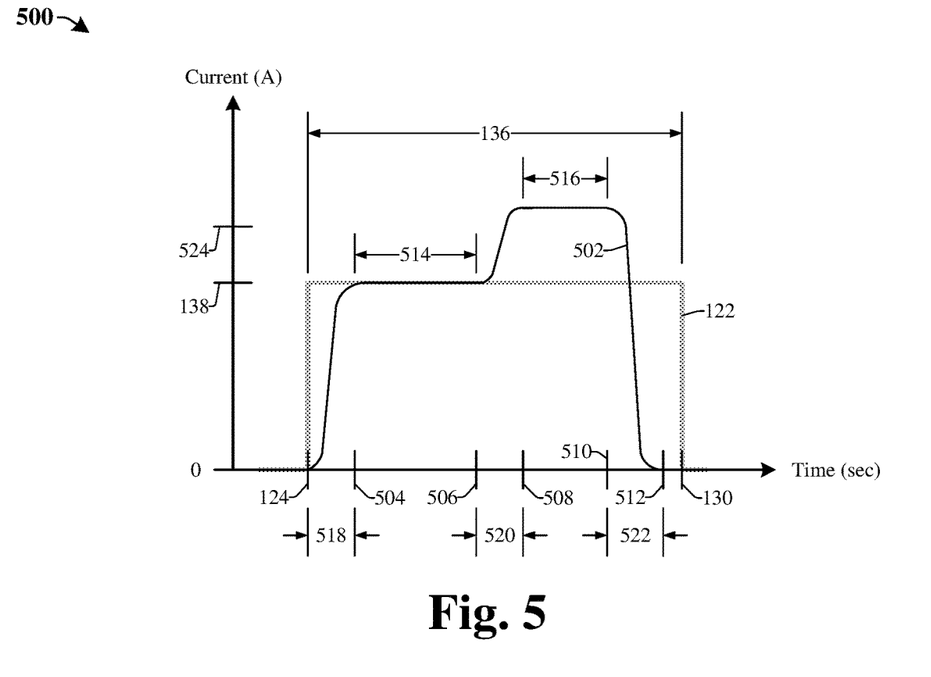
FIG. 5 illustrates a graph of some embodiments of a fifth signal for programming memory cells.

FIG. 5 illustrates a graph 500 of some embodiments of a fifth signal 502 for programming memory cells.

In some embodiments, the fifth signal 502 is similar to the first signal 120 of FIG. 1B. For example, a current level of the fifth signal 502 is set (e.g., by circuitry 114 of FIG. 1A) to a first value 138 for a first period of time 514, the current level of the fifth signal 502 is adjusted from the first value 138 to a second value 524 for a second period of time 516, and the current level of the fifth signal 502 is adjusted from the second value 524 to a third value (e.g., zero) for at least a third period of time (not labeled). However, in the fifth signal 502 there exists a first transition time 518 (e.g., a rise time from a reference start time 124 to a first time 504) during which the current level of the fifth signal 502 transitions from zero to the first value 138, a second transition time 520 (e.g., a rise time from a second time 506 to a third time 508) during which the current level of the fifth signal 502 transitions from the first value 138 to the second value 524, and a third transition time 522 (e.g., a fall time from a fourth time 510 to a fifth time 512) during which the current level of the fifth signal transitions from the second value 524 back to zero.

In some embodiments, the first transition time 518 spans from before the first period of time 514 to a beginning of the first period of time 514, the second transition time 520 spans from an end of the first period of time 514 to a beginning of the second period of time 516, and the third transition time spans from an end of the second period of time 516 to a beginning of the third period of time (not labeled).

In some embodiments, the fifth signal 502 is differentiable. In some embodiments, the first signal 120 of FIG. 1B may be referred to as a theoretical write signal while the fifth signal 502 may be referred to as an experimental write signal.

Although transition periods (e.g., 518, 520, 522) are only illustrated in FIG. 5 with regard to the fifth signal 502, it will be appreciated that in some embodiments, any of the first signal 120, the second signal 202, the third signal 302, the fourth signal 402, or some other suitable programming signal may similarly comprise transition periods.

In some embodiments, the circuitry 114 may, for example, comprise a driver circuit, some other hardware, some combination of hardware and software, or some other suitable circuitry. In some embodiments, the transistors (e.g., 112a-112d) may, for example, be or comprise metal-oxide-semiconductor field effect transistors or the like. In some embodiments, the current values (e.g., 138, 140, 212, 312, 314, 416, 418, 420, 524) may, for example, be on the order of milliamps. In some embodiments, the times (e.g., 124, 126, 128, 130, 204, 206, 304, 306, 404, 406, 408, 504, 506, 508, 510, 512) may, for example, be on the order of nanoseconds.

Figure 6:
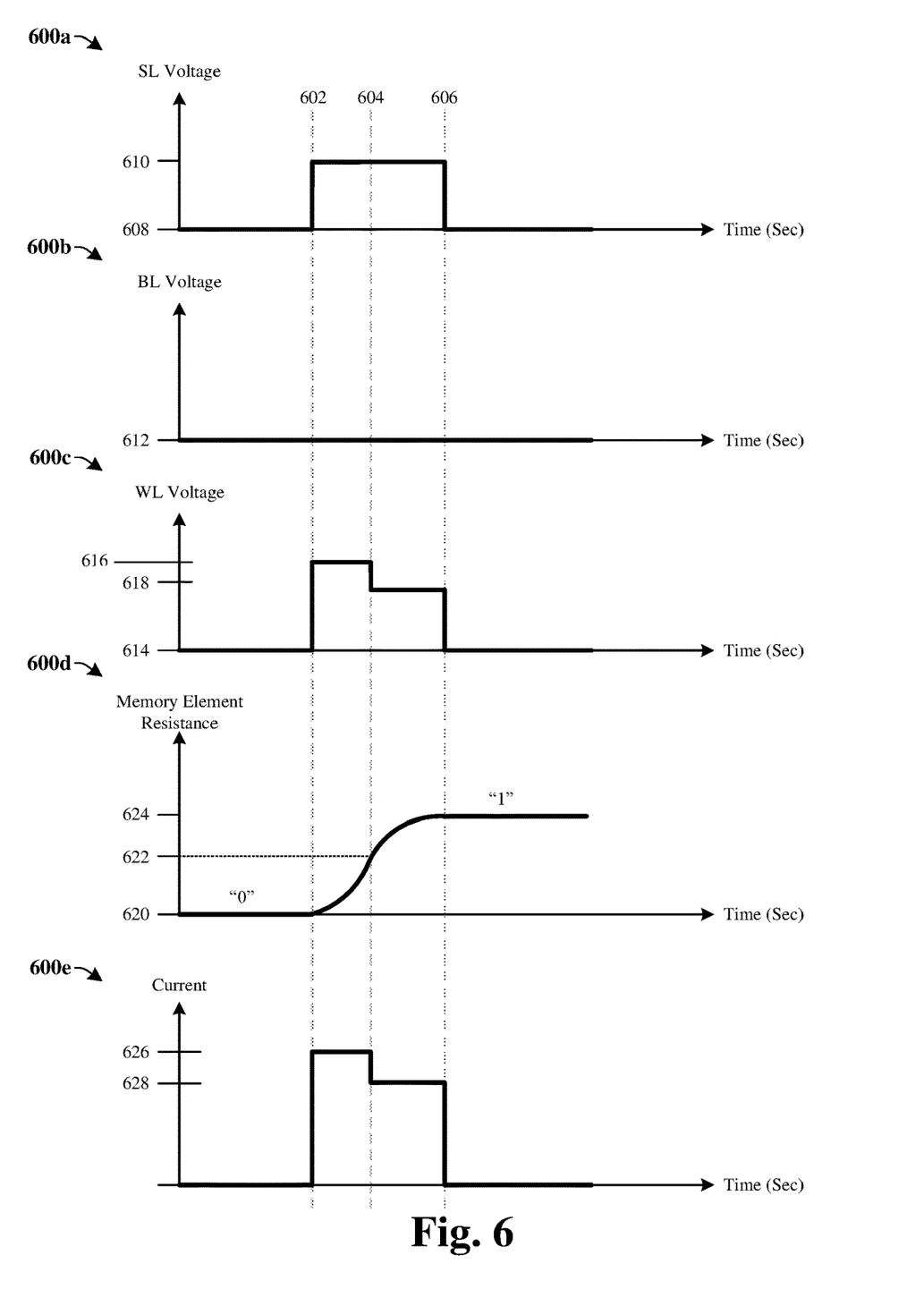
FIGS. 6-9 illustrate graphs of some embodiments of a source line voltage, a bit line voltage, a word line voltage, a memory element resistance, and a current passing through the memory element, respectively.

FIG. 6 illustrates graphs 600a-600e of some embodiments of a source line (e.g., 108a of FIG. 1A) voltage, a bit line (e.g., 104a of FIG. 1A) voltage, a word line (e.g., 106A of FIG. 1A) voltage, a memory element (e.g., 110A of FIG. 1A) resistance, and a current passing through the memory element, respectively.

In some embodiments, when programming the memory element, a first current is passed through the memory element until the resistance of the memory element reaches a threshold, at which point a second current different from the first current (e.g., having a lower magnitude than the first current) is then passed through the memory element at least until the memory element reaches a desired resistance. In some embodiments, by providing a current of higher magnitude to the memory element to begin changing the resistance of the memory element and by providing a current of lower magnitude to finish changing the resistance, a power consumption and a speed of the programming may be improved.

For example, at a first time 602, the source line voltage is adjusted from a first source line voltage value 608 to a second source line voltage value 610 (e.g., by a source line driver 114c of FIG. 1), the bit line voltage is set to a first bit line voltage value 612 (e.g., by a bit line driver 114a of FIG. 1A), and the word line voltage is adjusted from a first word line voltage value 614 to a second word line voltage value 616 (e.g., by a word line driver 114b of FIG. 1A). As a result, a first current 626 passes from the source line to the bit line through the memory element, which causes the resistance of the memory element to begin to change from a first resistance value 620 toward a second resistance value 624. The source line voltage, bit line voltage, and word line voltage are maintained at the aforementioned values at least until the resistance of the memory element reaches the first threshold 622 at a second time 604.

At the second time 604, the word line voltage is adjusted from the second word line voltage value 616 to a third word line voltage value 618 that has a lower magnitude than the second word line voltage value 616. As a result, a second current 628 (e.g., a current of a lesser magnitude) passes from the source line to the bit line through the memory element which causes the resistance of the memory element to continue changing toward the second resistance value 624. In some embodiments, using the second current 628 causes the resistance to change at a slower rate than when the first current 626 was used. The source line voltage, bit line voltage, and word line voltage are maintained at the aforementioned values at least until the resistance of the memory element reaches the second resistance value 624 at a third time 606.

In some embodiments, the first threshold 622 is a percentage of a difference between the first resistance value 620 and the second resistance value 624. For example, the first threshold may, for example, be 50% of the difference (e.g., half way between the two), 60% of the difference, 70% of the difference, or some other suitable value. In some embodiments, the first resistance value 620 represents a logic "0" and the second resistance value 624 represents a logic "1". Although FIG. 6 illustrates changing the state of the memory device from a logic "0" to a logic "1", it will be appreciated that this threshold based programming operation may also be used when changing the state from a logic "1" to "0". In some embodiments, the first resistance value 620 and the second resistance value 624 may, for example, be predetermined resistances.

Figure 7:
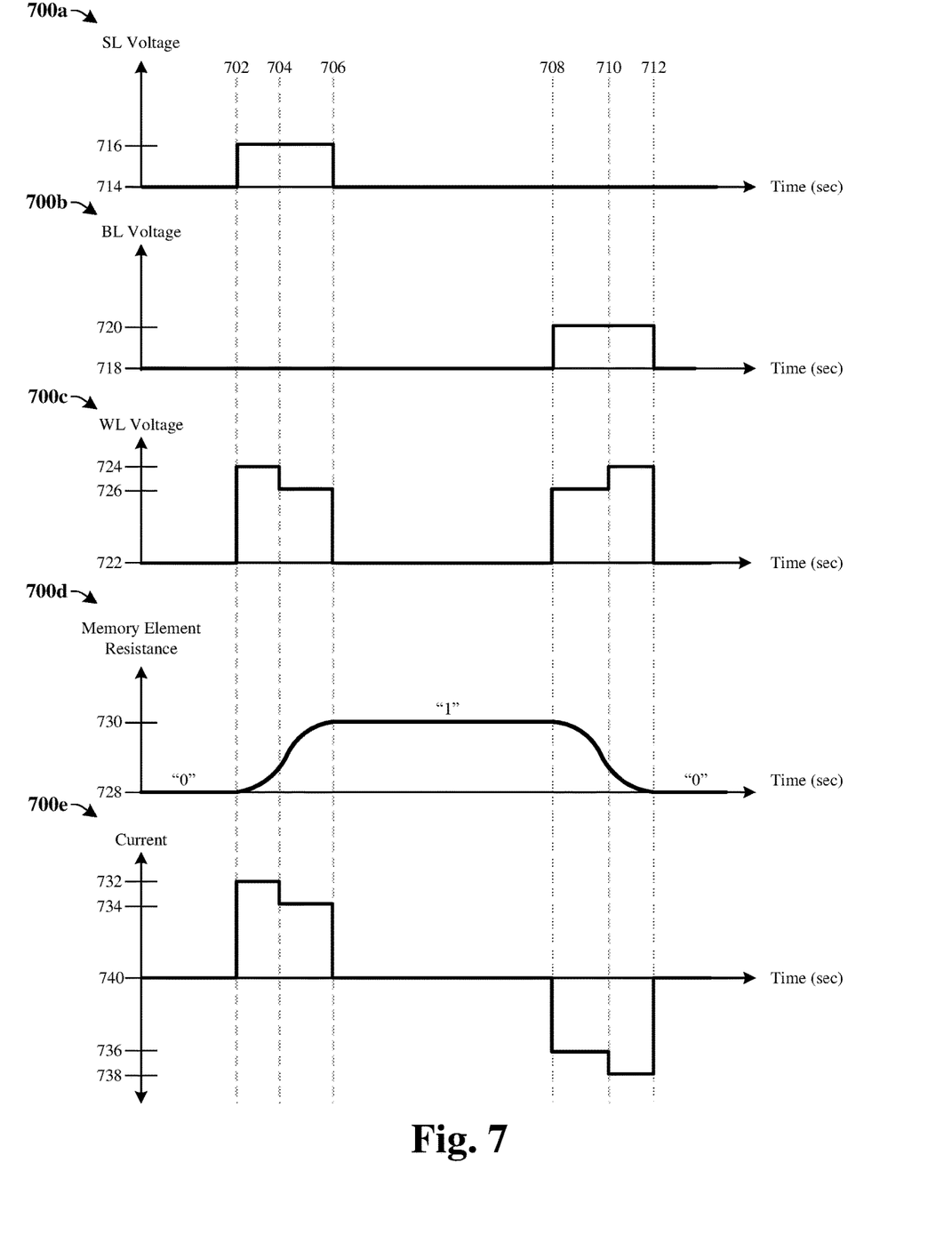

FIG. 7 illustrates graphs 700a-700e of some alternative embodiments of a source line (e.g., 108a of FIG. 1A) voltage, a bit line (e.g., 104a of FIG. 1A) voltage, a word line (e.g., 106A of FIG. 1A) voltage, a memory element (e.g., 110A of FIG. 1A) resistance, and a current passing through the memory element, respectively.

In some embodiments, a magnitude step-down current signal may be used when changing the memory element from a low resistance state to a first resistance state (e.g., when programming a logic "1") and a magnitude step-up current signal may be used when changing the memory element from a first resistance state to a second resistance state (e.g., when programing a logic "0"), or vice versa. By providing a step-down current to write a first resistance state and a step-up current to write a second resistance state, a performance of the programming (e.g., a speed or power consumption) may be improved.

For example, at a first time 702, the source line voltage is adjusted from a first source line voltage value 714 to a second source line voltage value 716, the bit line voltage is set to a first bit line voltage value 718, and the word line voltage is adjusted from a first word line voltage value 722 to a second word line voltage value 724. As a result, a first current 732 passes from the source line to the bit line through the memory element, which causes the resistance of the memory element to begin to change from a first resistance value 728 toward a second resistance value 730. The source line voltage, bit line voltage, and word line voltage are maintained at the aforementioned values until a second time 704.

At the second time 704, the word line voltage is adjusted from the second word line voltage value 724 to a third word line voltage value 726 that has a lower magnitude than the second word line voltage value 724. As a result, a second current 734 (e.g., a current having a lesser magnitude than the first current 732) passes from the source line to the bit line through the memory element and the resistance of the memory element to continues approaching the second resistance value 730. The source line voltage, bit line voltage, and word line voltage are maintained at the aforementioned values at least until the resistance of the memory element reaches the second resistance value 730 at a third time 706.

At the third time 706, the word line voltage and the source line voltage are set to the first word line voltage value 722 and the first source line voltage value 714, respectively. As a result, a third current 740 is passed through the memory element.

At a fourth time 708, the source line voltage is set to the first source line voltage value 714, the bit line voltage is adjusted from the first the first bit line voltage value 718 to a second bit line voltage value 720, and the word line voltage is adjusted from the first word line voltage value 722 to the third word line voltage value 726. As a result, a fourth current 736 passes from the bit line to the source line through the memory element, which causes the resistance of the memory element to begin to change from the second resistance value 730 toward the first resistance value 728. The source line voltage, bit line voltage, and word line voltage are maintained at the aforementioned values until a fifth time 710.

At the fifth time 710, the word line voltage is adjusted from the third word line voltage value 726 to the second word line voltage value 724. As a result, a fifth current 738 (e.g., a current having a lesser magnitude than the fourth current 736) passes from the bit line to the source line through the memory element and the resistance of the memory element to continues approaching the first resistance value 728. The source line voltage, bit line voltage, and word line voltage are maintained at the aforementioned values at least until the resistance of the memory element reaches the first resistance value 728 at a sixth time 712.

At the sixth time 712, the word line voltage and the bit line voltage are set to the first word line voltage value 722 and the first bit line voltage value 718, respectively. As a result, the third current 740 is passed through the memory element.

Figure 8:
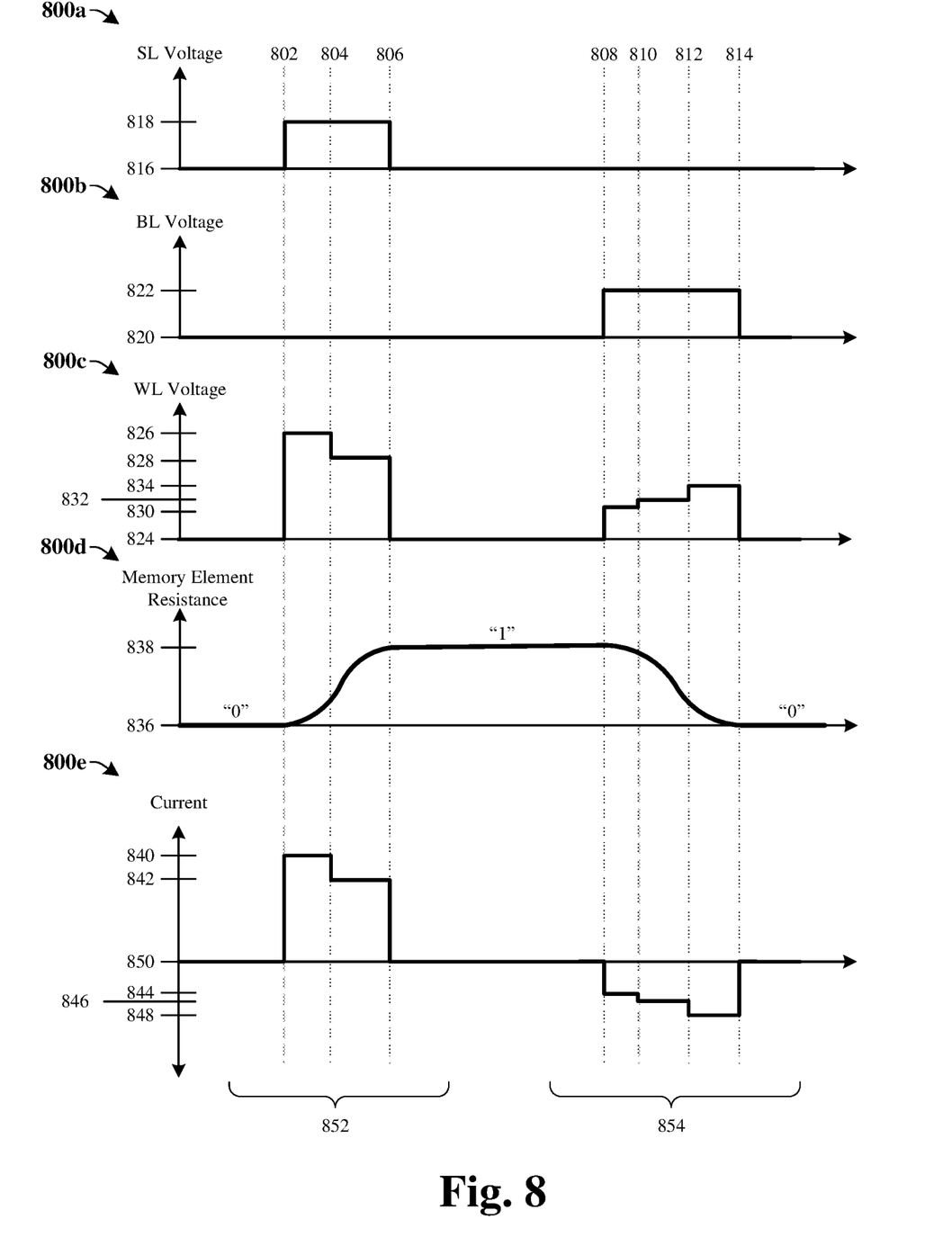

FIG. 8 illustrates graphs 800a-800e of some alternative embodiments of a source line (e.g., 108a of FIG. 1A) voltage, a bit line (e.g., 104a of FIG. 1A) voltage, a word line (e.g., 106A of FIG. 1A) voltage, a memory element (e.g., 110A of FIG. 1A) resistance, and a current passing through the memory element, respectively.

In some embodiments, when the memory array is operating in a standard power mode, currents having higher magnitudes and shorter durations are used to program the memory element, and when the memory array is operating in a low power mode, currents having lower magnitudes and longer durations are used to program the memory element. Thus, quick programming speed may be given priority over low power consumption during standard power mode while low power consumption may be given priority over quick programming speed during low power mode. As a result, a performance of the memory array may be improved. For example, if operating on battery power, a battery life of the battery powering the memory array may be improved when operating in low power mode (e.g., because power is proportional to current squared and thus lower currents correspond to lower power).

For example, a standard power mode is employed during a first period of time 852 and a low power mode is employed during a second period of time 854.

At a first time 802, the source line voltage is adjusted from a first source line voltage value 816 to a second source line voltage value 818, the bit line voltage is set to a first bit line voltage value 820, and the word line voltage is adjusted from a first word line voltage value 824 to a second word line voltage value 826. As a result, a first current 840 passes from the source line to the bit line through the memory element, which causes the resistance of the memory element to begin to change from a first resistance value 836 toward a second resistance value 838. The source line voltage, bit line voltage, and word line voltage are maintained at the aforementioned values until a second time 804.

At the second time 804, the word line voltage is adjusted from the second word line voltage value 826 to a third word line voltage value 828 that has a lower magnitude than the second word line voltage value 826. As a result, a second current 842 passes from the source line to the bit line through the memory element and the resistance of the memory element to continues approaching the second resistance value 838. The source line voltage, bit line voltage, and word line voltage are maintained at the aforementioned values at least until the resistance of the memory element reaches the second resistance value 838 at a third time 806.

At the third time 806, the word line voltage and the source line voltage are set to the first word line voltage value 824 and the first source line voltage value 816, respectively. As a result, a third current 850 is passed through the memory element.

At a fourth time 808, the source line voltage is set to the first source line voltage value 816, the bit line voltage is adjusted from the first bit line voltage value 820 to a second bit line voltage value 822, and the word line voltage is adjusted from the first word line voltage value 824 to a fourth word line voltage value 830. As a result, a fourth current 844 passes from the bit line to the source line through the memory element, which causes the resistance of the memory element to begin to change from the second resistance value 838 toward the first resistance value 836. The source line voltage, bit line voltage, and word line voltage are maintained at the aforementioned values until a fifth time 810.

At the fifth time 810, the word line voltage is adjusted from the fourth word line voltage value 830 to a fifth word line voltage value 832. As a result, a fifth current 846 passes from the bit line to the source line through the memory element and the resistance of the memory element to continues approaching the first resistance value 836. The source line voltage, bit line voltage, and word line voltage are maintained at the aforementioned values until a sixth time 812.

At the sixth time 812, the word line voltage is adjusted from the fifth word line voltage value 832 to a sixth word line voltage value 834. As a result, a sixth current 848 passes from the bit line to the source line through the memory element and the resistance of the memory element to continues approaching the first resistance value 836. The source line voltage, bit line voltage, and word line voltage are maintained at the aforementioned values at least until the resistance of the memory element reaches the first resistance value 836 at a seventh time 814.

At the seventh time 814, the word line voltage and the bit line voltage are set to the first word line voltage value 824 and the first bit line voltage value 820, respectively. As a result, the third current 850 is passed through the memory element.

In some embodiments, the fourth current 844, the fifth current 846, and the sixth current 848 have lower magnitudes than the first current 840 and the second current 842. In some embodiments, a time between the fourth time 808 and the seventh time 814 is longer than a time between the first time 802 and the third time 806. Thus, the programming during the first period of time 852 (e.g., when in standard power mode) is quicker and may use more power than the programming during the second period of time 854 (e.g., when in low power mode).

Figure 9:
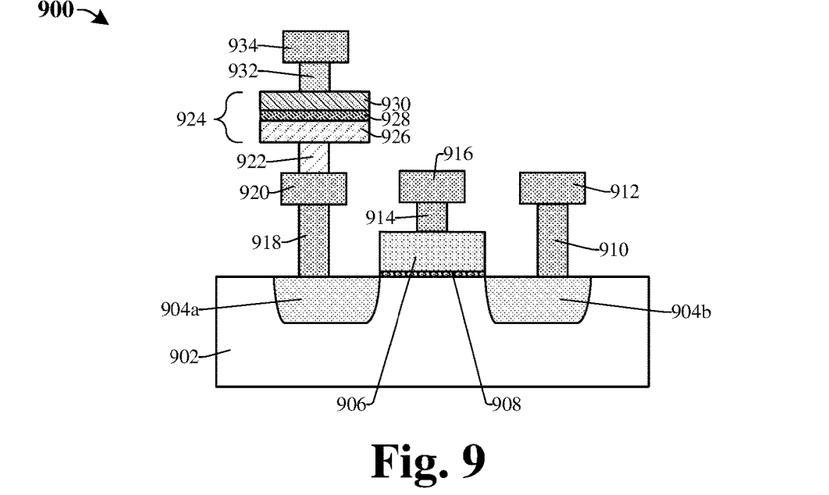

FIG. 9 illustrates a cross-sectional view 900 of some embodiments of a memory cell (e.g., 102a of FIG. 1A).

In some embodiments, a first source/drain region 904a and a second source/drain region 904b are arranged along a substrate 902. A gate 906 extends along the substrate 902 between the first source/drain region 904a and the second source/drain region 904b. A gate dielectric 908 separates the gate 906 from the substrate 902.

A conductive source line 912 is arranged over the second source/drain region 904b. A first contact 910 extends from the conductive source line 912 to the second source/drain region 904b. A conductive word line 916 is arranged over the gate 906. A second contact 914 extends from the conductive word line 916 to the gate 906.

A landing pad 920 is arranged over the first source/drain region 904a. A third contact 918 extends between the landing pad 920 and the first source/drain region 904a. A memory element 924 (e.g., an MTJ or the like) is arranged over the landing pad 920. In some embodiments, the memory element 924 comprises a magnetic reference layer 926, a magnetic free layer 930, and a tunnel barrier layer 928 between the magnetic reference layer 926 and the magnetic free layer 930. A bottom electrode 922 extends from the memory element 924 to the landing pad 920. The conductive bit line 934 is arranged over the memory element 924. A top electrode 932 extends from the conductive bit line 934 to the memory element 924.

Figure 10:
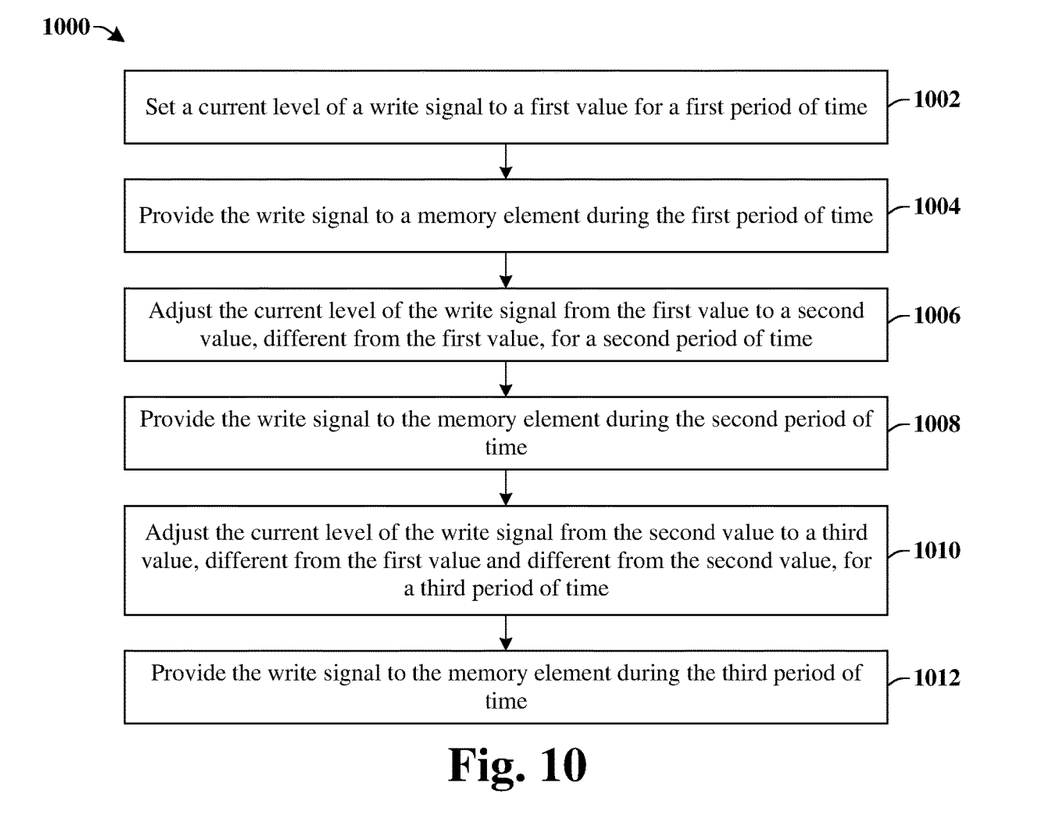
FIGS. 10-12 illustrate flow diagrams of some embodiments of methods for programming memory elements.

FIG. 10 illustrates a flow diagram of some embodiments of a method 1000 for programming a memory element.

At 1002, a current level of a write signal is set to a first value for a first period of time. FIG. 1B and FIG. 6 illustrate graph 100b and graphs 600a-600e of some embodiments corresponding to act 1002.

At 1004, the write signal is provided to a memory element during the first period of time. FIG. 1B and FIG. 6 illustrate graph 100b and graphs 600a-600e of some embodiments corresponding to act 1004.

At 1006, the current level of the write signal is adjusted from the first value to a second value, different from the first value, for a second period of time. In some embodiments, the current level of the write signal is adjusted to the second value when a resistance of the memory element reaches a threshold. FIG. 1B and FIG. 6 illustrate graph 100b and graphs 600a-600e of some embodiments corresponding to act 1006.

At 1008, the write signal is provided to the memory element during the second period of time. FIG. 1B and FIG. 6 illustrate graph 100b and graphs 600a-600e of some embodiments corresponding to act 1008.

At 1010, the current level of the write signal is adjusted from the second value to a third value, different from the first value and different from the second value, for a third period of time. FIG. 1B and FIG. 6 illustrate graph 100b and graphs 600a-600e of some embodiments corresponding to act 1010.

At 1012, the write signal is provided to the memory element during the third period of time. FIG. 1B and FIG. 6 illustrate graph 100b and graphs 600a-600e of some embodiments corresponding to act 1012.

Figure 11:
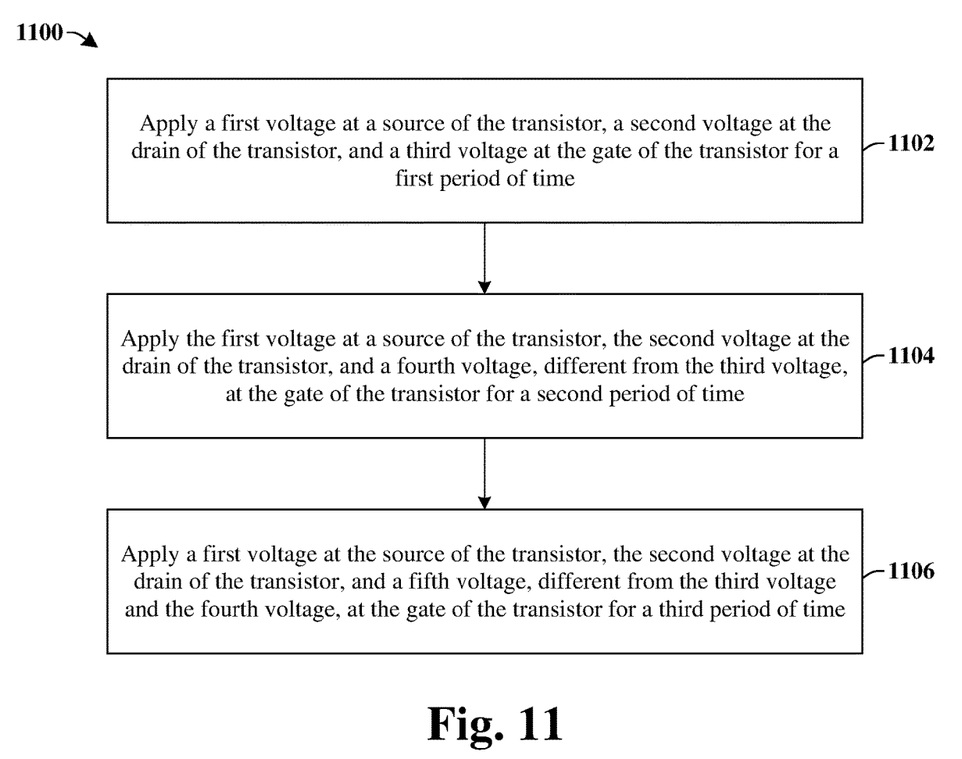

FIG. 11 illustrates a flow diagram of some embodiments of a method 1100 for programming a memory element.

At 1102, apply a first voltage at a source of the transistor, a second voltage at the drain of the transistor, and a third voltage at the gate of the transistor for a first period of time. FIG. 1A and FIG. 6 illustrate a diagram 100a and graphs 600a-600e of some embodiments corresponding to act 1102.

At 1104, apply the first voltage at a source of the transistor, the second voltage at the drain of the transistor, and a fourth voltage, different from the third voltage, at the gate of the transistor for a second period of time. FIG. 1A and FIG. 6 illustrate a diagram 100a and graphs 600a-600e of some embodiments corresponding to act 1104.

At 1106, apply a first voltage at the source of the transistor, the second voltage at the drain of the transistor, and a fifth voltage, different from the third voltage and the fourth voltage, at the gate of the transistor for a third period of time. FIG. 1A and FIG. 6 illustrate a diagram 100a and graphs 600a-600e of some embodiments corresponding to act 1106.

Figure 12:
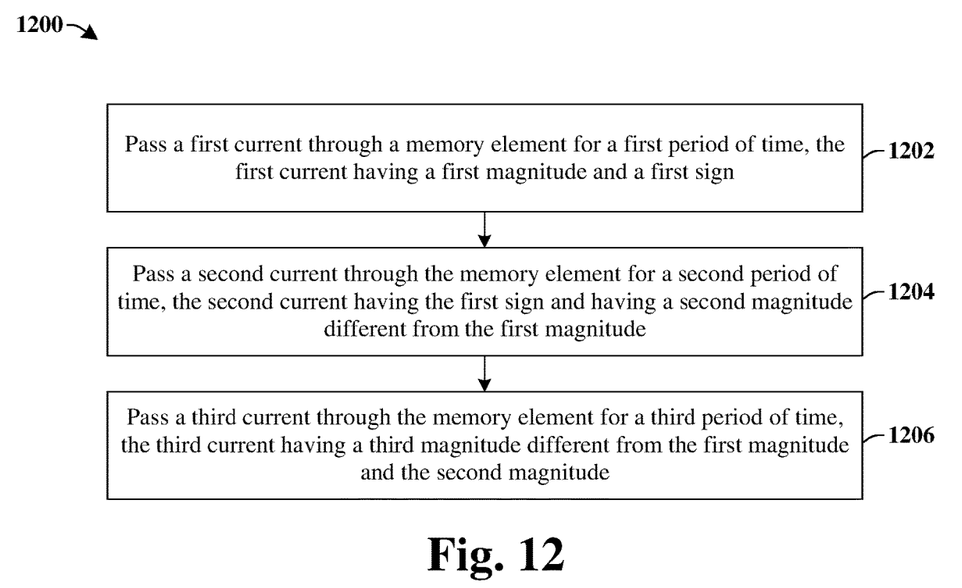

FIG. 12 illustrates a flow diagram of some embodiments of a method 1200 for programming a memory element. While methods 1000-1200 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a first current is passed through a memory element for a first period of time, the first current having a first magnitude and a first sign. FIG. 1B and FIG. 6 illustrate a graph 100b and graphs 600a-600e of some embodiments corresponding to act 1202.

At 1204, a second current is passed through the memory element for a second period of time, the second current having the first sign and having a second magnitude different from the first magnitude. In some embodiments, the second current is passed in response to a resistance of the memory element reaching a threshold. FIG. 1B and FIG. 6 illustrate a graph 100b and graphs 600a-600e of some embodiments corresponding to act 1204.

At 1206, a third current is passed through the memory element for a third period of time, the third current having a third magnitude different from the first magnitude and the second magnitude. FIG. 1B and FIG. 6 illustrate a graph 100b and graphs 600a-600e of some embodiments corresponding to act 1206. In some embodiments, the third magnitude has the first sign. In some other embodiments, the third magnitude has no sign (e.g., is zero).

Thus, the present disclosure relates to a method for programming a memory cell that improves a performance of the programming.

Accordingly, in some embodiments, the present disclosure relates to a method. The method comprises setting a current level of a write signal to a first non-zero value for a first period of time. The write signal is provided to a memory element during the first period of time. The current level of the write signal is adjusted from the first non-zero value to a second non-zero value, different from the first non-zero value, for a second period of time. The write signal is provided to the memory element during the second period of time. The current level of the write signal is adjusted from the second non-zero value to a third value, different from the first non-zero value and different from the second non-zero value, for a third period of time. The write signal is provided to the memory element during the third period of time.

In other embodiments, the present disclosure relates to a method for programming memory. The method comprises passing a first current through a memory element for a first period of time, the first current having a first magnitude and a first sign. The method comprises passing a second current through the memory element for a second period of time, the second current having the first sign and having a second magnitude different from the first magnitude. The method further comprises passing a third current through the memory element for a third period of time, the third current having a third magnitude different from the first magnitude and the second magnitude.

In yet other embodiments, the present disclosure relates to a circuit. The circuit comprises a memory array. The memory array comprises a first memory cell coupled to a first bit line, a first source line, and a first word line. The first memory cell comprises a first memory element. Circuitry is coupled to the first memory element and is configured to change a logic state of the first memory element by providing a write signal to the first memory element. The write signal has a first current for a first period of time, a second current for a second period of time, and a third current for a third period of time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a memory array comprising a memory cell coupled to a bit line, a source line, and a word line, wherein the memory cell comprises a memory element; and
   circuitry coupled to the memory element and configured to change a logic state of the memory element by providing a write signal to the memory element, the write signal having a first current for a first period of time, a second current for a second period of time, and a third current for a third period of time.

2. The circuit of claim 1, wherein the memory cell further comprises a transistor, wherein the transistor and the memory element are coupled in series between the bit line and the source line, and wherein a gate of the transistor is coupled to the word line.

3. The circuit of claim 2, wherein the circuitry is coupled to the bit line, the source line, and the word line.

4. The circuit of claim 3, wherein the circuitry provides the write signal having the first current, the second current, and the third current by applying a first voltage at the gate of the transistor for the first period of time, applying second voltage at the gate for the second period of time, and applying a third voltage at the gate for the third period of time.

5. The circuit of claim 1, wherein the first current has a first magnitude and a first sign, wherein the second current has a second magnitude, different from the first magnitude, and the first sign, and wherein the third current has a third magnitude, different from the first magnitude and the second magnitude.

6. The circuit of claim 1, wherein the circuitry comprises a bit line driver, a source line driver, and a word line driver, and wherein the bit line driver is coupled to the bit line, the source line driver is coupled to the source line, and the word line driver is coupled to the word line.

7. The circuit of claim 6, wherein the circuitry further comprises control circuitry coupled to the bit line driver, the source line driver, and the word line driver.

8. The circuit of claim 7, wherein the control circuitry is configured to provide control signals to the bit line driver, the word line driver, and the source line driver.

9. The circuit of claim 1, wherein the memory element comprises a magnetic tunnel junction.

10. A circuit comprising:
a bit line;
a source line;
a word line;
a memory cell coupled to the bit line, the source line, and the word line, the memory cell comprising a memory element; and
circuitry coupled to the memory cell and configured to program the memory cell by providing a first current to the memory element during a first period of time and providing a second current, different than the first current, to the memory element during a second period of time.

11. The circuit of claim 10, wherein the circuitry comprises a bit line driver coupled to the bit line, a source line driver coupled to the source line, a word line driver coupled to the word line, and control circuitry coupled to the bit line driver, the source line driver, and the word line driver.

12. The circuit of claim 10, wherein the first current has a first non-zero magnitude and a first sign, wherein the second current has a second non-zero magnitude, different than the first non-zero magnitude, and the first sign.

13. The circuit of claim 10, wherein the memory cell further comprises a transistor, wherein the transistor and the memory element are coupled in series between the bit line and the source line.

14. The circuit of claim 13, wherein the transistor comprises a first source/drain region, a second source/drain region, and a gate layer, wherein a first electrode of the memory element is coupled to the first source/drain region, a second electrode of the memory element is coupled to the bit line, the word line is coupled to the gate layer, and the source line is coupled to the second source/drain region.

15. The circuit of claim 14, wherein the memory element comprises a magnetic reference layer coupled to the first electrode, a magnetic free layer coupled to the second electrode, and a tunnel barrier layer between the magnetic reference layer and the magnetic free layer.

16. A circuit comprising:
a bit line;
a source line;
a word line;
a memory array comprising a memory cell, the memory cell coupled to the bit line, the source line, and the word line, the memory cell comprising a memory element; and
a bit line driver coupled to the bit line;
a source line driver coupled to the source line; and
a word line driver coupled to the word line,
wherein the bit line driver, the source line driver, and the word line driver are configured program the memory element with a first current during a first period of time and a second current, different than the first current, during a second period of time.

17. The circuit of claim 16, wherein the memory cell further comprises a transistor, wherein the transistor and the memory element are coupled in series between the bit line and the source line, and wherein the word line driver is coupled to the transistor by the word line, the source line is coupled to the transistor by the source line, and the bit line driver is coupled to the memory element by the bit line.

18. The circuit of claim 17, wherein the word line driver is configured to program the memory element by generating a first voltage at the word line during the first period of time so the first current passes through the memory element during the first period of time and by generating a second voltage, different than the first voltage, at the word line during the second period of time so the second current passes through the memory element during the second period of time.

19. The circuit of claim 16, further comprising:
control circuitry coupled to the bit line driver, the source line driver, and the word line driver, the control circuitry configured to provide control signals to the bit line driver, the source line driver, and the word line driver.

20. The circuit of claim 16, wherein the first current has a first non-zero magnitude and the second current has a second non-zero magnitude, different than the first non-zero magnitude.

* * * * *